United States Patent
Melchinger et al.

(10) Patent No.: US 10,775,277 B2
(45) Date of Patent: Sep. 15, 2020

(54) SAMPLING DEVICE FOR INTRODUCING INDIVIDUALIZED SEED GRAINS INTO A MEASURING DEVICE, SYSTEM AND METHOD FOR SORTING A PLURALITY OF SEED GRAINS, AND USES THEREOF

(71) Applicant: Universität Hohenheim, Stuttgart (DE)

(72) Inventors: Albrecht Eugen Melchinger, Stuttgart (DE); Franz-Josef Mauch, Stuttgart (DE)

(73) Assignee: Universität Hohenheim, Mannheim (DE)

( * ) Notice: Subject to any disclaimer, the term of this patent is extended or adjusted under 35 U.S.C. 154(b) by 86 days.

(21) Appl. No.: 16/065,009

(22) PCT Filed: Dec. 20, 2016

(86) PCT No.: PCT/EP2016/081844
§ 371 (c)(1),
(2) Date: Jun. 21, 2018

(87) PCT Pub. No.: WO2017/108740
PCT Pub. Date: Jun. 29, 2017

(65) Prior Publication Data
US 2019/0003931 A1    Jan. 3, 2019

(30) Foreign Application Priority Data
Dec. 21, 2015    (DE) .................. 10 2015 226 349

(51) Int. Cl.
*G01N 1/18*    (2006.01)
*G01N 1/08*    (2006.01)
(Continued)

(52) U.S. Cl.
CPC ................. *G01N 1/18* (2013.01); *B07C 5/18* (2013.01); *B07C 5/3425* (2013.01); *B07C 5/38* (2013.01);
(Continued)

(58) Field of Classification Search
CPC .. G01N 1/18; G01N 1/08; G01N 1/20; G01N 24/08
(Continued)

(56) References Cited

U.S. PATENT DOCUMENTS 7,367,155 B2    5/2008    Kotyk et al.
8,752,712 B2    6/2014    Deppermann
(Continued)

FOREIGN PATENT DOCUMENTS

| CN | 201237646 Y | 5/2009 |
| CN | 103592326 A | 2/2014 |
| EP | 0411932 A2 | 2/1991 |

OTHER PUBLICATIONS

European Patent Office, International Preliminary Report on Patentability for PCT/EP2016/081844, dated Jun. 26, 2018.
(Continued)

*Primary Examiner* — Jamel E Williams
(74) *Attorney, Agent, or Firm* — Ice Miller LLP

(57) ABSTRACT

The present invention relates to a system (110) and a method for sorting a plurality (112) of seed grains (114). The system (110) comprises an individualizing device (120), a sampling device (132) for introducing the individualized seed grain (114) into a measuring device (136) for the classification of the individualized seed grain (114), a receiving device (146, 200) for receiving the classified seed grain (114) and also a transporting device (118, 124, 134, 144, 152) for the at least partially pneumatic transport of the seed grain (114).

(Continued)

The invention also relates to the sampling device (132), which comprises an outer tube (160) for receiving the sampling device (132) into the measuring device (136), a sample chamber (138) of the measuring device (136) being provided within a volume (164) of the outer tube (160). The sampling device (132) also comprises an inner tube (162), which is inserted in the outer tube (160) and has a lower opening (166), whereby the individualized seed grain (114) can be introduced into the volume (164) of the outer tube (160). An intermediate space (170) formed between the outer tube (160) and the inner tube (162) is designed in such a way that the individualized seed grain (114) can be discharged by pneumatic means out of the outer tube (160) through the inner tube (162) into a receiving device (146, 200) for the classified seed grain (114).

The system (110) is suitable as an automated high-throughput sorting of seed grains (114) by using the measuring device (136) that is designed for investigations of the seed grains (114) by means of a method of nuclear magnetic resonance (140) and/or an optical measuring method.

16 Claims, 4 Drawing Sheets

(51) Int. Cl.

| | | |
|---|---|---|
| *G01N 24/08* | (2006.01) | |
| *B07C 5/342* | (2006.01) | |
| *B07C 5/38* | (2006.01) | |
| *G01R 33/30* | (2006.01) | |
| *G01N 1/20* | (2006.01) | |
| *B07C 5/18* | (2006.01) | |
| *G01N 21/3563* | (2014.01) | |
| *G01N 21/359* | (2014.01) | |

(52) U.S. Cl.
CPC .............. *G01N 1/08* (2013.01); *G01N 1/20* (2013.01); *G01N 24/08* (2013.01); *G01R 33/307* (2013.01); *B07C 2501/009* (2013.01); *G01N 21/359* (2013.01); *G01N 21/3563* (2013.01)

(58) Field of Classification Search
USPC ..................................... 73/863.01
See application file for complete search history.

(56) References Cited

U.S. PATENT DOCUMENTS

| | | | |
|---|---|---|---|
| 2003/0188998 | A1* | 10/2003 | Deppermann ........... A01C 1/00 209/592 |
| 2006/0042528 | A1* | 3/2006 | Deppermann ......... A01C 1/025 111/171 |
| 2014/0266196 | A1 | 9/2014 | Dai et al. |

OTHER PUBLICATIONS

European Patent Application, International Search Report for PCT/EP2016/081844, dated Mar. 16, 2017.
European Patent Application, Written Opinion of the International Searching Authority for PCT/EP2016/081844, dated Mar. 16, 2017.
Silvela, L., Rodgers, R., Barrera, A., and Alexander, D. E. (1989), Effect of selection intensity and population size on percent oil in maize, Zea mays L., Theoretical and Applied Genetics, 78 (2), pp. 298-304.
Kotyk, J.J., Pagel, M.D., Deppermann, K.L., Colleti, R.F., Hoffman, N.G., Yannakakis, E.J., Ackerman, J.J.H. (2005), High-throughput determination of oil content in corn kernels using nuclear magnetic resonance imaging, Journal of the American Oil Chemists' Society, 82(12), pp. 855-862.
Blanco M. and Villarroya, I. (2002), NIR spectroscopy: a rapid-response analytical tool, Trends in Analytical Chemistry, 21(4), pp. 240-250.
Baye, T.M., Pearson, T.C., and Settles, A.M. (2006), Development of a calibration to predict maize seed composition using single kernel near infrared spectroscopy, Journal of Cereal Science, 43 (2), pp. 236-243.
Niewitetzki, O., Tillmann, P., Becker, H. C., and Möllers, C. (2010), A new near-infrared reflectance spectroscopy method for high-throughput analysis of oleic acid and linolenic acid content of single seeds in oilseed rape (*Brassica napus* L.), Journal of Agricultural and Food Chemistry, 58 (1), pp. 94-100.
Rolletschek, H., Fuchs, J., Friedel, S., Börner, A., Todt, H., Jakob, P. M., and Borisjuk, L. (2015), A novel noninvasive procedure for high-throughput screening of major seed traits, Plant Biotechnology Journal, 13 (2), pp. 188-199.
Melchinger, A.E., W. Schipprack, H. F. Utz, V. Mirdita, In Vivo Haploid Induction in Maize: Identification of Haploid Seeds by Their Oil Content, Crop Sci. 54, 2014, pp. 1497-1504.
Karayel D., I, D. Barut, Z. B. and Özmerzi, A. (2004), Mathematical Modelling of Vacuum Pressure on a Precision Seeder, Biosystems Engineering, 87 (4), pp. 437-444.
Montes, J. M., Bulach, A., Martin, M., & Senger, E., Quantitative Trait Variation in Self- and Cross-Fertilized Seeds of *Jatropha curcas* L.: Parental Effects of Genotypes and Genetic Pools, BioEnergy Research, 2015, doi:10.1007/s12155-014-9576-8.
National Intellectual Property Administration, PRC (CNIPA), First Office Action (and English translation) of Chinese Patent Application No. CN 201680074421.6, dated Dec. 4, 2019.

\* cited by examiner

SAMPLING DEVICE FOR INTRODUCING INDIVIDUALIZED SEED GRAINS INTO A MEASURING DEVICE, SYSTEM AND METHOD FOR SORTING A PLURALITY OF SEED GRAINS, AND USES THEREOF

CROSS-REFERENCE TO RELATED APPLICATIONS

The present application is a U.S. national stage of, and claims the priority benefit of, International Patent Application Serial No. PCT/EP2016/081844, filed Dec. 20, 2016, and also claims the priority benefit of German Patent Application Serial No. 102015226349.5, filed Dec. 21, 2015, the text and drawings of which are hereby incorporated by reference in their entireties.

The present invention relates to a sampling device for introducing an individualized seed grain into a measuring device that is designed for investigating seed grains. The present invention also relates to a system and a method for sorting a plurality of seed grains as well as to the use of the system for an automated high-throughput sorting of the seed grains by using the sampling device.

PRIOR ART

Many applications in plant research and cultivation require quick, as nondestructive as possible methods of investigation for the exact and precise determination of properties of individual seed grains from a large number. One example of this is the ascertainment of an oil content of the seed grains. Silvela, L., Rodgers, R., Barrera, A., and Alexander, D. E. (1989), *Effect of selection intensity and population size on percent oil in maize, Zea mays L.*, Theoretical and Applied Genetics, 78 (2), pages 298-304, disclose that a significantly increased selection gain can be achieved if the selection of the seed grains is performed on the basis of individual grains.

Kotyk, J. J., Pagel, M. D., Deppermann, K. L., Colletti, R. F., Hoffman, N. G., Yannakakis, E. J., Ackerman, J. J. H. (2005), High-throughput determination of oil content in corn kernels using nuclear magnetic resonance imaging, Journal of the American Oil Chemists' Society, 82(12), pages 855-862 present various measuring methods for investigating the properties of individual seed grains, including solvent extraction, microwave-assisted extraction and SOXTHERM extraction. However, the methods presented therein are time-consuming and labor-intensive, while also often using chemicals which may destroy the seed grains or constituents thereof. These methods are therefore ruled out, in particular whenever the individual grains investigated are to be used for further research and cultivation. In addition, these methods often require a mass for the samples that often exceeds the mass of the individual grains available.

Therefore, nondestructive methods of investigation are preferably used for investigating the properties of seed grains. Blanco, M., and Villarroya, I. (2002), *NIR spectroscopy: a rapid-response analytical tool*, Trends in Analytical Chemistry, 21(4), pages 240-250 describe the related use of near infrared spectroscopy (NIRS) for ascertaining properties of a plurality of whole or ground seed grains, in particular their moisture content or content of hydrocarbons, proteins or oil. Baye, T. M., Pearson, T. C., and Settles, A. M. (2006), *Development of a calibration to predict maize seed composition using single kernel near infrared spectroscopy*, Journal of Cereal Science, 43 (2), pages 236-243, and Niewitetzki, O., Tillmann, P., Becker, H. C., and Möllers, C. (2010), *A new near-infrared reflectance spectroscopy method for high-throughput analysis of oleic acid and linolenic acid content of single seeds in oilseed rape (Brassica napus L.)*, Journal of Agricultural and Food Chemistry, 58 (1), pages 94-100, have found that NIRS investigations on individual grains produce much greater standard measuring errors in comparison with other methods of investigation, and are therefore only suitable for series investigations on samples with a high variance of the oil content.

Therefore, methods of nuclear magnetic resonance (NMR methods) are used with preference as a quick, nondestructive and precise method of investigation for determining properties of individual seed grains. For example, NMR methods are acknowledged as the standard method for ascertaining the oil and water content in individual seeds of various types of cereal; see for example *Determination of oil content (Reference method)*, ISO 659:2009). In addition, it is known for NMR methods to be used for investigating the water, hydrocarbon or protein content in individual seed grains.

However, the quick and efficient determination of the properties of a large number of seed grains still remains a challenge. Rolletschek, H., Fuchs, J., Friedel, S., Borner, A., Todt, H., Jakob, P. M., and Borisjuk, L. (2015), *A novel noninvasive procedure for high-throughput screening of major seed traits*, Plant Biotechnology Journal, 13 (2), pages 188-99 describe an automatic sample providing device, which is coupled to an NMR measuring device and can be used to achieve a daily throughput of up to 1400 samples. However, this device neither solves the problem of individualizing the seed grains nor achieves the task of selecting and/or sorting desired seed grains from a large number of seed grains. This also applies to another device, presented by Kotyk et al., see above, for determining the oil content in maize grains by means of imaging NMR methods (NMR imaging; MRI methods), in which the time required for providing the samples far exceeds the time necessary for the actual measurement.

US 2014/0266196 A1 discloses another NMR measuring device for seed grains that are transported by means of a circulating conveyor belt. However, this has the disadvantage of low measuring accuracy on account of the imprecise positioning of the seed grains in the measuring device and also the restriction to low-field NMR.

DE 601 29 158 T2 discloses methods and devices for the nondestructive analysis of seeds for determining a property within a sample by means of MRI imaging of a plurality of specimens, in order to use the information obtained by MRI imaging for the selection of individual grains. For providing the samples, individual plates with a plurality of depressions (wells), for example 24, 48, 96 or 960 wells, are loaded with individual grains. Following this, the plates are stacked in layers, for example 5, 8, 12 or more plates one on top of the other, in order in this way to produce a sample cube, the outside dimensions of which are designed such that it fits into a radio frequency coil of the NMR measuring device. Described as examples are sample cubes with dimensions of 15 cm×20 cm×12 cm for receiving a maximum of 480 seeds or with dimensions of 30 cm×35 cm×30 cm for receiving a maximum of 3456 seeds. Depending on the strength of the magnetic field of the NMR magnet and the desired resolution, several minutes to several hours are required for recording the MRI images. A disadvantage of this is that the investigations of the seed grains can only be performed in batch mode. Since the individual grains are arranged next to one another within the plates and one above the other within the layers, a high throughput of seed grains also requires a complex NMR measuring device with a large sample chamber within the radio frequency coil and also a magnetic field that is as strong and homogeneous as possible. In addition, this still does not achieve the task of individualizing the seed grains and charging the plates.

DE 603 18 032 T2 discloses an automated system for receiving, weighing and sorting particulate material, in particular seed grains. This involves the seed grains falling directly onto a weighing platform and being removed from the weighing platform by a blower after weighing has taken place.

The object of the present invention is therefore to overcome at least partially the disadvantages and restrictions known from the prior art of systems and methods for the investigation and, based thereupon, sorting of a plurality of seed grains classified by means of the investigation. In particular, it is intended to propose such a system and associated methods that make sorting possible with a high throughput of at least 300, preferably of at least 600, particularly preferably of at least 1000, individual grains per hour in a way that is as fully automatic as possible. For this purpose, it is intended in particular to propose a sample device which is designed for introducing an individualized seed grain into a measuring device for investigating an individual grain. The sorting of the seed grains is intended here to lead to a provision of at least two fractions of individual grains with different properties and/or make possible the provision of individually classified and individually easily accessible seed grains.

DISCLOSURE OF THE INVENTION

This object is achieved by a sampling device for introducing an individualized seed grain into a measuring device, by a system and method for sorting a plurality of seed grains and also by the use of the system with the features of the independent patent claims. Advantageous refinements can be found in the dependent patent claims.

In a first aspect, the present invention relates to a sampling device for introducing an individualized seed grain into a measuring device.

The term "sampling device" is understood here as meaning a device with which a sample can be preferably introduced into a sample chamber of the measuring device in such a way that as a result an investigation of at least one desired property of the sample can be performed on the sample. The "sample chamber" refers here as usual to the region of the measuring device that is designed for receiving the sample. The sampling device is particularly advantageously configured in such a way that the investigation of the sample within the sample chamber leads to a result that is as reproducible as possible, with the highest possible signal-to-noise ratio.

Within the scope of the present invention, the term "measuring device" relates in principle to any device that is suitable for the intended investigation and has a correspondingly configured sample chamber for receiving the sampling device. Measuring devices which are designed for carrying out methods of nuclear magnetic resonance (NMR methods) and/or imaging NMR methods (NMR imaging; MRI methods) are particularly preferred here. However, it is also possible to use other measuring devices, in particular optical measuring devices that are designed for carrying out spectroscopic methods. Other measuring devices that likewise have a sample chamber for receiving an adapted sampling device are however conceivable.

If the measuring device is for example an NMR measuring device, which is designed for carrying out NMR methods and/or MRI methods, the sampling device preferably provides the sample in such a way that the sample in the sample chamber is within a radio frequency coil of the NMR measuring device in a magnetic field that is as homogeneous as possible. If, on the other hand, the measuring device is for example an optical measuring device, which is designed for carrying out spectroscopic methods in an optical spectral range or a range adjacent to it, preferably in the infrared (NIS) range, in particular in the near infrared (NIRS) range, the sampling device can provide the sample preferably in such a way that the sample in the sample chamber is as far as possible within a light beam or within a disk of light of an optical radiation.

The present invention relates to the investigation of samples which comprise individual or individualized seed grains or a group described in more detail below of a few individualized seed grains. The "seed grain", which may also be referred to as "individual grain" or "seed", and according to the botanical terminology includes both seeds and fruits, may be any desired seed grain on which a property is to be ascertained by means of the measuring device. In a preferred embodiment, the seed grain is selected from the group of varieties that are listed in the Saatgutverkehrsgesetz (SaatG) [Seed Marketing Act] of the Federal Republic of Germany (date of issue Aug. 31, 1985, last amendment of Aug. 31, 2015), preferably all agricultural varieties, varieties of vegetable, and also all native and exotic cereal, oil, fiber, medicinal, herbal, fragrant and ornamental plant varieties and plants for producing cosmetics, and also varieties of wild plants and forest plants not listed there, preferably those that are enumerated in the list of tree species in the annex to the Forstvermehrungsgesetz (FoVG) [Forest Reproductive Material Act] of the Federal Republic of Germany (date of issue May 22, 2002, last amendment of Aug. 31, 2015). In a particularly preferred embodiment, the seed grain is a seed of maize or jatropha.

In addition, the term "seed grain" also includes artificially produced objects, in particular technological seeds and pill-shaped objects which, in shape and size, are similar or identical to naturally occurring seed grains.

The term "individualized seed grain" relates here to an individual seed grain that has been isolated from a plurality of seed grains in order to be classified and/or individualized by the subsequent determination of at least one of its properties. Provision of the individualized seed grain may preferably be performed by means of at least one individualizing device described more specifically below that is designed for individualizing seed grains from a plurality of seed grains provided. However, other possibilities are conceivable.

According to the invention, the individualized seed grains are subjected to a measurement and, on the basis thereof, preferably a classification, for which a suitable measuring device is used. Within the scope of the present invention, the term "classification" relates to the assignment of at least one value or range of values determined by means of the measuring device of a selected property in relation to a class to which an individualized seed grain or, alternatively, a group of at least two seed grains belongs, it being possible for the seed grains in the group to respectively take the form of an individualized seed grain or a fraction of individual grains with the same properties. For the assignment of the value or the range of values to a particular class, a threshold which the value has to stay above and/or below in order for the assignment to take place may be prescribed here. The classification of the seed grains may consequently lead to a provision of at least two fractions of individual grains with different properties. Alternatively or in addition, the provision of individually classified and individually accessible seed grains may be made possible in this way.

The sampling device proposed here in this case comprises at least an outer tube for receiving the sampling device into the measuring device, a sample chamber of the measuring device being provided within a volume of the outer tube, the outer tube having a closed bottom;

an inner tube for receiving an individualized seed grain, the inner tube being inserted in the outer tube and having an opening on its underside, whereby the individualized seed grain can be introduced into the volume of the outer tube; and an intermediate space between the outer tube and the inner tube, the intermediate space being designed in such a way that the individualized seed grain can be discharged by pneumatic means out of the outer tube through the inner tube into a receiving device for a classified seed grain.

According to the invention, the sampling device consequently has an outer tube, an inner tube inserted in the outer tube and an intermediate space formed in this way between the outer tube and the inner tube. The term "tube" refers here to an elongate hollow body that has a length along the longitudinal axis of the tube and a cross-sectional area perpendicular to the longitudinal axis, the length of the tube exceeding the root of its cross-sectional area. The cross section of the tube may in principle take any desired shape here, round shapes being preferred in particular. In the case of a round cross section, the tube consequently has an inner diameter and an outer diameter, the difference between which gives a wall thickness of the tube. For use in optical methods, the tube may preferably be formed as a transparent tube and consist in particular of glass, quartz or a transparent plastic. For use in NMR methods, it is advantageous if the tube comprises a material that is as permeable as possible to radio waves.

The outer tube is configured here in such a way that it is designed for the sampling device to be received in the measuring device. The measuring device is preferably designed for receiving the sampling device and preferably has a sample chamber that is arranged in the measuring device in such a way that at least a volume within the outer tube is within the sample chamber of the measuring device after the sampling device has been received in the measuring device. In this way it can be ensured that a sample in this volume of the outer tube is at the same time located in the sample chamber of the measuring device. As already mentioned, the sample may according to the invention comprise precisely one individualized seed grain or, alternatively, a group of a few individualized seed grains. The group of a few individualized seed grains is understood here as meaning a number of at least two individualized seed grains, a number of seed grains selected in an individual case depending in particular on the size and shape of the seed grains concerned and also the volume available in the inner tube. In this way, the throughput of seed grains through the sampling device and the associated system can be increased further.

According to the invention, a sample that is intended to enter the sample chamber of the measuring device can consequently be introduced via the inner tube into the outer tube, which is at the same time located in the sample chamber of the measuring device. In order to ensure a positioning of the individualized seed grain in the sample chamber that is as precise as possible, the inner tube is inserted in the outer tube and is open on its underside. As a result, the individualized seed grain can, in particular by the gravitational force of its own weight, pass from the downwardly open inner tube into the downwardly closed outer tube, which has a closed bottom.

As already mentioned, here both the outer tube and the inner tube preferably have a round cross-sectional area, the inner tube being inserted in the outer tube in a centered manner, whereby an annular intermediate space can form between the outer tube and the inner tube. If the sample chamber is thus likewise arranged in a centered manner above the bottom of the outer tube and the open end of the inner tube is located as far as possible within the sample chamber, the individualized seed grain can be introduced directly into the centered sample chamber. In a particular configuration, the inner tube may be mounted here displaceably along its longitudinal axis counter to the longitudinal axis of the outer tube. In this way, this configuration can ensure that, largely independently of the shape and size, the sample enters as exactly as possible the volume of the sampling device that at the same time represents the sample chamber of the measuring device.

According to the invention, the sampling device is also configured in such a way that the individualized sample that is also at least partially classified by means of the measuring device can be removed again from the volume of the sampling device, in particular after a measuring operation, in order to make space again in this volume for a further sample. Provided for this purpose is the intermediate space arranged between the outer tube and the inner tube, which can be configured in an annular form for the case where both the outer tube and the inner tube inserted in the outer tube have a round cross-sectional area. The intermediate space may preferably be designed here for feeding compressed air into the outer tube, so that, by being subjected to compressed air, the individualized seed grain can consequently be discharged from the outer tube through the inner tube, in order in this way to pass from the sampling device into a receiving device for a classified seed grain by a blowing-out operation. It may be particularly advantageous for this purpose if the inner tube is introduced into the outer tube in such a way that, as far as possible, the inner tube only ends above the closed bottom of the outer tube by a gap, the width of which may correspond approximately to the width of the intermediate space. In this way, a vortex flow that may have advantageous effects on the desired discharge of the individualized seed grain from the outer tube can form at the closed bottom of the outer tube.

In an alternative configuration, the classified seed grain located in the outer tube may be discharged by means of being extracted by suction through the inner tube, it being possible here for the intermediate space and the gap to be used in particular for allowing a pressure equalization.

In order also to ensure that the classified sample is also actually directed to the receiving device, and cannot for instance incorrectly return to a preceding module, in particular the individualizing device or the weighing device, in a particularly preferred configuration the sampling device may have a setting device, which is designed for controlling an opening between an inlet for the individualized seed grain and an outlet to the receiving device for the classified seed grain. For controlling the setting device, an air curtain may be provided, which can prevent the classified seed grain from being directed back to the preceding module, in particular during the operation of blowing out the seed grain. The term "air curtain" refers here to a device which, by means of directed air masses, provides a barrier of flowing air that can separate spatial regions from one another so as in this way to prevent an exchange between the separated regions.

A combination of pneumatic transport of the classified seed grain and a direction of its continued path by means of the settable device can consequently ensure that the classified seed grain can enter the receiving device after the measuring operation, and thereby provide space in the sampling device for a subsequent individualized seed grain. By suitably controlling the blowing-out operation and the settable device, a cycle by which the individualized seed grains are successively introduced into the sampling device and discharged can be set up here in a preferred way. In this way, at least 300, preferably at least 600, particularly preferably at least 1000, individual grains per hour can be respectively fed one after the other to a measuring operation.

In a preferred configuration, the sampling device has a connection device, which is designed for receiving the outer tube, the inner tube and also an inlet and an outlet for an air exchange for the pneumatic transport of the seed grain, in particular for supplying compressed air or extraction air and/or for a pressure equalization in the two tubes. The connection device may preferably be configured here in such a way that it has receptacles for the outer tube and inner tube that are configured in such a way that an annular intermediate space is able to form between the outer tube and the inner tube, it being possible for the connection device to be designed to allow the two tubes to be adjusted in relation to one another with respect to their longitudinal axes. The connection device may in particular serve the purpose of establishing a form- and/or force-fitting connection between the sampling device and a receptacle of the measuring device intended for insertion of the sampling device into the measuring device. In this way, the sampling device including the inlet for the individualized seed grain and the outlet for the classified seed grain can be closed off in a pressure-tight manner, in order in this way to allow full functionality of the sampling device with regard to a successive introduction and discharge of the seed grains.

For further details with respect to the sampling device, reference is made to the following description of the exemplary embodiments.

In a further aspect, the present invention relates to a system for sorting a plurality of seed grains. The system comprises
at least one individualizing device for individualizing seed grains from a plurality of seed grains provided;
at least one sampling device for introducing the individualized seed grain into a measuring device that can be used for the classification of the individualized seed grain;
at least one filling device for introducing the classified seed grain into a receiving device; and
at least one transporting device for the at least partially pneumatic transport of the seed grain from a store into the individualizing device, from the individualizing device into the sampling device and from the sampling device into the receiving device.

The term "system" is understood here as meaning a generally multi-part device in which modules that comprise the devices mentioned, and may possibly include further devices, are arranged in such a way as to interact with one another. In a particularly preferred configuration, the system may in this case additionally have a weighing device as a further module, which is designed for ascertaining a weight of an individualized seed grain in the course of a weighing operation. In this way, the weight thus ascertained of the individualized seed grain can be set in relation to the other properties determined in the measuring device.

The individualizing device serves here for performing an individualizing operation, which consists here in individualizing the seed grains from a plurality of seed grains that can be fed to the system from a store provided for this purpose. In particular in order to make it possible for the sorting method proposed here to be carried out undisturbed for as long as possible, the individualizing device may additionally be provided with a vibrating device or an agitating mechanism, whereby, as experimental investigations have shown, a blockage of the individualizing device, in particular due to clogging with seed grains, and consequently of the entire system can be largely avoided.

Any device that is designed for this purpose may be used here as the individualizing device. Preferably, however, the individualizing device described by Karayel, D., Barut, Z. B., and Özmerzi, A. (2004), *Mathematical Modelling of Vacuum Pressure on a Precision Seeder*, Biosystems Engineering, 87 (4), pages 437-444, which is already used in pneumatic precision seed drills, may be preferably used. This individualizing device comprises a feed hopper, a rotating vacuum plate with an exchangeable separating head and a profiled plate, which is directed against the vacuum plate and provides a channel for the transport of the individual grain. By providing a negative pressure at a central opening of the separating head, the diameter of which may preferably be approximately one tenth of the size of the seed grain, the seed grain can be held firmly against the separating head until it is released. After a quarter turn of the individualizing device, the seed grain can be ejected by means of an air surge, in order to pass into another module of the present system, preferably through an ejection tube.

In a particular configuration, the ejection tube may be arranged here in such a way that, as a result, the seed grain can be guided to the inlet described above for the individualized seed grain in the sampling device. Preferably, however, the ejection tube may be arranged in such a way that, as a result, the seed grain is directed to an inlet of the weighing device, which may preferably be arranged directly after the individualizing device, in order thus to carry out the weighing operation before the measuring operation. Alternatively, the seed grain may also be fed first to the sampling device, before it is directed to the inlet of the weighing device, in order thus to be able to perform the weighing operation only after the measuring operation. Other possibilities are conceivable.

In a preferred configuration, the seed grain may be carried from the ejection tube of the individualizing device onto the weighing device by means of gravitational force, the weighing device preferably being able to have a damping device which is designed for reducing the impact of the force initiated by the seed grain on the weighing device. Use of a damping device may be advantageous in particular whenever the weighing device is a precision balance, which is particularly suitable for the case of the present invention, in order as far as possible to avoid an overloading caused by a seed grain falling onto the balance and/or by formation of an air pressure after removal of the seed grain. The term "precision balance" refers here to a weighing device which complies with the specifications for precision balances, i.e. a non-automatic balance of accuracy class II, set out in the standard *Metrologische Aspekte der nichtselbsttätigen Waagen* [metrological aspects of non-automatic weighing instruments], EN 45501:2015, German version DIN EN 45501:2016-03. Therefore, the use of a precision balance is also particularly advantageous because a typical seed grain has a very small weight. For example, a maize grain weighs about 100 mg to 500 mg, while a rapeseed grain is much lighter and has a weight of approximately 1.5 mg to 10 mg. Ascertaining the weight of the seed grain as accurately as possible may be suitable in particular for the purpose of significantly reducing the measuring error when determining a weight-related property of the seed grain.

In a particularly preferred configuration, the seed grain may be carried from the ejection tube of the individualizing device, in particular by means of gravitational force, first onto a planar plate. The planar plate may have here at least two openings, it being possible for a first opening to be provided for the weighing device and another opening to be provided for feeding to the inlet into the sampling device. The transport of the individualized seed grain on the planar plate may preferably take place here by way of a lateral mechanical movement of the seed grain, for instance by pushing the seed grain, for example with the aid of a rotary magazine, over the surface of the planar plate. In this way, the overloading of the weighing device described above, caused by a seed grain falling onto the balance and/or by creation of air pressure after removal of the seed grain, can be avoided almost completely.

After the weighing operation has been performed, the seed grain can then be directed to the inlet described above for the individualized seed grain in the sampling device. This may preferably take place because the ejection tube from the individualizing device may be connected to a rotary magazine with four preferably controllable holding points, it being possible for one holding point to be connected to a weighing position for performing the weighing operation, for the performance of which a turn of the rotary magazine may be provided as a time interval. After the weighing operation has been performed, first a further quarter turn of the rotary magazine may be performed before the seed grain is actually directed to the inlet for the individualized seed grain in the sampling device. In this way, consequently, a double time interval can be provided for the measuring operation in the measuring device. For this purpose, the planar plate described above may have at least two parking positions, which are arranged in a planar manner on the plate and in which the seed grain can remain during a parking operation.

As already described above, the feeding of the individualized seed grain into the inlet for the individualized seed grain in the sampling device, with or without the previously carried out weighing operation, may preferably be performed by a gravitational force, in that the individualized seed grain which is intended to enter the sample chamber of the measuring device can be introduced via the inner tube into the outer tube of the measuring device, which at the same time is located in the sample chamber of the measuring device. The sampling device described in more detail in the present application preferably serves here as the sampling device for introducing the individualized seed grain into a measuring device that can be used for the classification of the individualized seed grain.

The system also comprises at least one transporting device, which is designed for the at least partially pneumatic transport of the seed grain from a store into the individualizing device, from the individualizing device into the sampling device and from the sampling device into the receiving device. The transporting device may preferably also be configured for further transporting operations, in particular for transporting the seed grain into the weighing device and out of the weighing device. The term "transporting device" is understood here as meaning any desired, preferably multi-part device that has modules which are respectively designed for transporting the seed grain, preferably the seed grain individualized in the individualizing device, from a first location to a second location. For this purpose, the transporting device may preferably have devices which make it possible to use compressed air and/or an extracting operation for performing at least some of the transporting operations by pneumatic means. Some other of the transporting operations may be performed here by means of other possibilities, in particular by means of the use of gravitational force. It is also conceivable that some selected transporting operations can be performed by means of using an industrial robot; however, experimental tests in this respect have shown that customary industrial robots are only able to achieve the task unsatisfactorily, and/or with considerable expenditure, because of the non-identical size of seed grains actually occurring. By contrast, with the preferred selection described here of a combination of mechanically and pneumatically controlled transporting operations, the object stated at the beginning, of feeding at least 300, preferably at least 600, particularly preferably at least 1000, individual grains per hour respectively to a measuring operation, in which natural variations of the size and the weight of the seed grains remain insignificant, can be achieved in a reliable way.

The present system also has at least one filling device for introducing the classified seed grain into the receiving device, which is designed for receiving the seed grain classified in particular in the measuring device and/or the weighing device. For performing an associated sorting operation, in principle any receiving device that can receive at least one classified seed grain, preferably a number of classified seed grains, may be suitable. Feeding the classified seed grain into the receiving device may preferably be performed here with a flexible tube, which is designed for receiving the seed grain from the outlet described above of the sampling device, it preferably being possible for the filling device to be equipped with a guiding head for the distribution and introduction of the seed grain into an intended part of the receiving device.

In a first preferred configuration, the receiving device may have for this at least two containers designed for receiving the at least one classified seed grain. However, the receiving device preferably has at least four, preferably six, particularly preferably ten, containers, which can respectively receive different fractions of seed grains. In particular when an industrial robot is used, a two-dimensional repository can thus be formed, in which the number of containers is ultimately only limited by the space available. The containers may for example be made of plastic, paper or paperboard. The containers are preferably arranged next to one another, allowing that the classified seed grain can be introduced into a selected container in particular by means of a suitably dimensioned pivoting device. In this way, the present receiving device consequently also differs from the receiving device presented by Rolletschek et al., see above, which requires manual loading of the containers. Other configurations are however conceivable.

In a further, particularly preferred configuration, the receiving device may have for this a repository for receiving the classified seed grains. The term "repository" is understood here as meaning a plate which has a number of depressions, which may also be referred to as "wells", for example 48, 60, 96, 240, 300, 480, 600 or 960 wells, for receiving a classified seed grain, in particular in each case precisely one classified seed grain, or, alternatively, a group described above of a few classified seed grains, in precisely one depression. The depressions may preferably be distributed here over the plate in the form of a matrix. A solid, transparent material, in particular glass, quartz or a transparent plastic, may serve here as the material for the plate. The technical configuration can be very flexibly carried out here. The plate may in this case assume outer dimensions of $5 \times 10$ cm$^2$ to $100 \times 200$ cm$^2$, preferably of $10 \times 20$ cm$^2$ to $50 \times 100$ cm$^2$, and a thickness of 0.5 cm to 5 cm, preferably of 1 cm to 2.5 cm.

For performing the sorting operation, it may be possible that the classified seed grain can be introduced into a selected depression in particular by means of a pneumatically operable filling device. However, other configurations are conceivable, in particular a repository that has containers distributed over the repository in the form of a matrix for receiving respectively a specific fraction of classified seed grains.

For removing a specific selected individualized classified seed grain from the repository, several possibilities are conceivable. In spite of the disadvantages described above, the use of an industrial robot may be possible in an individual case. Preferably, however, a pneumatic discharge of the selected seed grain may take place for example into a sample tube by subjecting the individual grain to compressed air. For this purpose, at the bottom of each depression of the repository there may be provided in particular an opening of a cross-sectional area that is preferably much smaller than the dimensions of the seed grain located therein, through which the compressed air required for removing the selected seed grain can be introduced into the respective depression. Alternatively, an extraction of the seed grain from the respective depression by suction may also take place. In particular, a movable platform by means of which the plate-shaped repository can be moved within a plane above or below a removing device may be provided for this purpose. Other configurations are conceivable.

Furthermore, each depression may be assigned a unique number, whereby a later identification of the individualized classified seed grain is made possible. On the basis of the assignment of a unique number to each depression, individual grains in a sample tube or some other suitable storing device can consequently be individually provided with a label, it even being possible as a consequence of this unique assignment for a labeling process to be performed automatically. The label may be provided directly with the properties of the seed grain labeled with it. Alternatively or in addition, a classification designation may be directly indicated and/or a barcode used, reading which allows the associated properties of the individualized seed grain to be accessed.

Furthermore, the performance of a manual removing operation may be advantageous. In a particular configuration, an additional plate, which has an optically controllable display device and which may in particular be arranged substantially parallel under the transparent repository containing the seed grains, may be provided for this purpose. The optically controllable display device may preferably have for this purpose a matrix of operable lighting devices, in particular light-emitting diodes (LEDs), each depression preferably being assigned precisely one lighting device. In this way, a position of a depression in which the desired seed grain to be removed is located, and which is at the same time assigned a unique number, can be indicated in a clear way by means of the optically controllable display device, in order that the position of the selected seed grain can be reliably indicated to a user. In this way, errors in the removal of the individual seed grain can be largely avoided.

The proposed system may also comprise an electronic control device, which may in particular be designed for controlling the system, preferably the transport of the seed grain from the store to the receiving device. In addition, the electronic control device may also have one or more further modules, which may be designed for further tasks. These include in particular a control for performing the operation of providing the store, the individualizing operation, the weighing operation, the measuring operation, the sorting operation and/or the removing operation. Furthermore, the electronic control device may perform the control of the assignment described above of a unique number to each depression in the repository of the receiving device for the identification of the individualized classified seed grains.

In addition, the electronic control device may also be used for presenting ascertained measurement data from the measuring device, the weighing device and/or possibly further devices, in particular in real time. For example, for this purpose measurement data obtained may be provided for a user directly and/or in a processed form, for instance as histograms or in the form of statistical analyses, even after or even already during the process of sorting a plurality of seed grains. In this way, in particular threshold values that are used for classifying the plurality of seed grains can be adapted after or even already during an ongoing sorting process. Similarly, in this way a remote monitoring (remote control) of the present system and of the associated method can be made possible.

In a further aspect, the present invention relates to a method for sorting a plurality of seed grains which comprises at least method steps a) to c) described below, method steps a) to d) being repeated as often as it takes until all the seed grains are sorted or the method being interrupted before that by an arbitrary blockage in the system or by an arbitrary ending of the method. The method steps are specifically:
  a) individualizing seed grains from a plurality of seed grains provided;
  b) introducing the individualized seed grain into a sampling device, the sampling device being designed for introducing an individualized seed grain into a measuring device that can be used for the classification of the individualized seed grain;
  c) determining a weight of an individualized seed grain, the individualized seed grains respectively being individually fed mechanically to a weighing device for ascertaining a weight of the individualized seed grain, the weighing device being a precision balance; and
  d) introducing the classified seed grain into a receiving device by means of a filling device;
  the seed grain being transported at least partially by pneumatic means from a store successively to various devices that are respectively designed for carrying out one of the method steps, and method step c) being carried out after method step a) and before method step d).

In an advantageous way, method steps a) to d) may be performed here for an individual seed grain one after the other in the given sequence, beginning with method step a), followed by method step b), with method step c) and with method step d), method steps a) to d) being carried out at least partially also at the same time for successive seed grains. For example, here a selected seed grain may be individualized in method step a), while at the same time a seed grain previously individualized in method step a) is at the same time classified according to method step b). Other possibilities are conceivable.

In one particular configuration, in particular to allow the individual steps to be carried out in the form of a cycle, respectively suitable time intervals may be provided, to which the performance of the steps is respectively assigned, it also being possible for breaks in the performance to be provided between two steps. For example, two successive time intervals may be provided for the classification of a first seed grain according to method step b), a second seed grain being subjected to an individualization according to method step a) during the first time interval, while the second seed grain is at rest in the second time interval. Other possibilities are conceivable.

For carrying out the method according to the invention, the electronically controllable device described above, which has a program code designed for carrying out the method, may be provided here.

In a particularly preferred configuration, the method according to the invention may be performed by means of the system described above for sorting a plurality of seed grains.

For further details with respect to the method, reference is made to the remaining description, in particular with respect to the system and with respect to the sampling device.

In a further aspect, the present invention relates to a use of a system presented here for an automated high-throughput sorting of seed grains by using a measuring device that is designed for investigations of the seed grains, in particular for investigations by means of a method of nuclear magnetic resonance and/or an optical measuring method. The term "high-throughput sorting" refers here to the sorting of at least 300, preferably of at least 600, particularly preferably of at least 1000, individual grains per hour, as far as possible in a fully automatic way, it being possible for the sorting of the seed grains to lead to a provision of at least two fractions of individual grains with different properties and/or to make possible a provision of individually classified and individually accessible seed grains.

The present system is consequently suitable for a wide range of applications in plant cultivation and research, for example for use in the sorting of haploid and hybrid maize grains. Preferred applications may concern maize grains on the basis of the oil content that originate from instances of crossing an inductor and a maternal parent that differ greatly from one another in their oil content, as described in the publication by Melchinger, A. E., W. Schipprack, H. F. Utz, V. Mirdita, *In Vivo Haploid Induction in Maize: Identification of Haploid Seeds by Their Oil Content*, Crop Sci. 54, 2014, pages 1497-1504. Similarly, it may be suitable for the sorting of self- and cross-fertilized seeds in the production of hybrids of oil plants between crosses of two parents that differ greatly from one another in their oil content, as proposed for example for jatropha by Montes, J. M., Bulach, A., Martin, M., & Senger, E., *Quantitative Trait Variation in Self- and Cross-Fertilized Seeds of Jatropha curcas L.: Parental Effects of Genotypes and Genetic Pools*, BioEnergy Research, 2015, doi:10.1007/s12155-014-9576-8. Further applications may concern quality control of seed grains or, alternatively, pills in the pharmaceutical industry.

BRIEF DESCRIPTION OF THE FIGURES

Preferred exemplary embodiments of the present invention are represented in the figures and described in more detail in the description which follows, without restricting generality. In the figures.

EMBODIMENTS OF THE INVENTION

Figure 1:
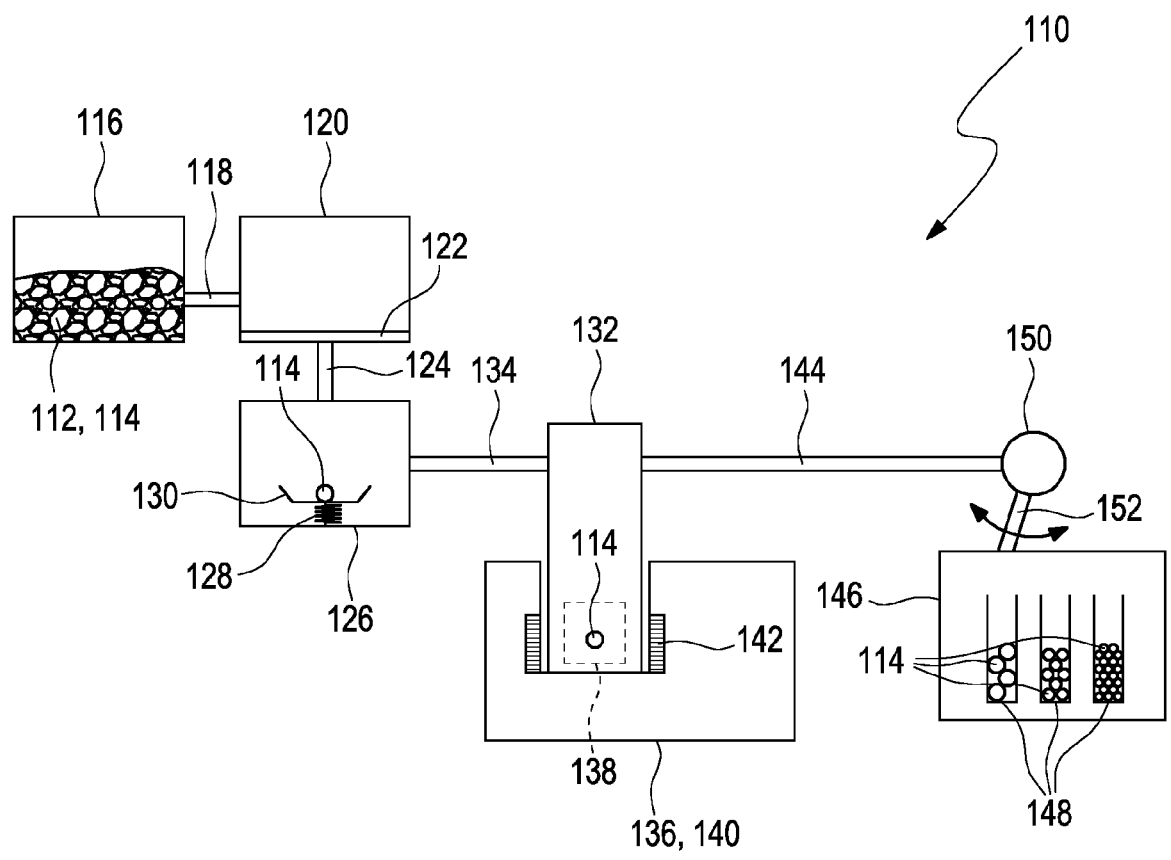
FIG. 1 shows a schematic representation of a preferred exemplary embodiment of a system according to the invention for sorting a plurality of seed grains.

FIG. 1 schematically shows a preferred exemplary embodiment of a system 110 according to the invention for sorting a plurality 112 of seed grains 114. The plurality 112 of seed grains 114 is provided in this exemplary embodiment in the form of a store 116, from which in each case some of the seed grains 114 are directed by means of a first transporting device 118 to an individualizing device 120, which is designed for individualizing the seed grains 114 from the plurality 112 of seed grains 114 provided. The first transporting device 118, located between the store 116 and the individualizing device 120, may direct the seed grains 114 to the individualizing device 120 here by mechanical means, in particular by the effect of gravitational force, and/or by pneumatic means, in particular by means of subjecting them to compressed air and/or by an operation of extraction by suction. The individualizing device 120 may preferably be configured here according to the publication by Karayel et al., see above, and be additionally provided with a vibrating device 122, in particular in order to make it possible for the sorting method proposed here to be carried out undisturbed for as long as possible. Experimental investigations have shown that in this way a blockage of the individualizing device 120, for instance due to clogging with seed grains 114, and consequently of the entire system 110 can be largely avoided.

By means of a second transporting device 124, the seed grains 114 individualized in the individualizing device 120 can be respectively individually fed to a weighing device 126 for ascertaining a weight of an individualized seed grain 114. The individualized seed grain 114 may be carried here from the individualizing device 120 onto the weighing device 126 by means of gravitational force, the weighing device 126 in this exemplary embodiment having a damping device 128, which is designed for reducing the impact of a force initiated by the seed grain 114 on the weighing device 126. Further configurations, for instance by feeding by mechanically moving (pushing) over a surface of a planar plate (not shown), are likewise possible. In this way it is possible to avoid an overloading of the weighing device 126 which can be caused by a seed grain 114 falling onto a precision balance 130 and/or by formation of air pressure after removal of the seed grain 114 from the precision balance 130. Alternatively, the individualized seed grain 114 may also be directed first to a sampling device 132 before it is fed to the weighing device 126 or without weighing being performed, thereby making it possible to dispense with the weighing device 126 completely. The second transporting device 124 then coincides with a third transporting device 134, which guides the individualized seed grain 114 to the sampling device 132.

According to the invention, the sampling device 132 is designed for introducing the individualized seed grain 114 into a measuring device 136, which can be used for a classification of the individualized seed grain 114. By means of the sampling device 132, the individualized seed grain 114 can be introduced as a sample into a sample chamber 138 of the measuring device 136 in such a way that an investigation of at least one desired property is thereby carried out on the individualized seed grain 114, whereupon the individualized seed grain 114 is then also referred to as a classified seed grain 114. The sampling device 136 represented here is configured in such a way that the investigation of the individualized seed grain 114 within the sample chamber 138 leads to a result that is as reproducible as possible, with the highest possible signal-to-noise ratio. A particularly preferred embodiment of the sampling device is schematically represented in FIG. 2.

Since, in the present exemplary embodiment, the measuring device 136 is designed as an NMR measuring device 140 for carrying out methods of nuclear magnetic resonance (NMR methods) or imaging NMR methods (NMR imaging; MRI methods), the sample chamber 138 is located within a radio frequency coil 142 of the NMR measuring device 140, in which there forms a magnetic field that is as homogeneous as possible and into which the individualized seed grain 114 is introduced for the investigation of the at least one desired property. Alternatively or in addition, use of some other measuring device is possible, in particular an optical measuring device which is designed for carrying out spectroscopic methods in an optical spectral range or a range adjacent to it, preferably in the infrared (NIS) range, in particular in the near infrared (NIRS) range.

Figure 2:
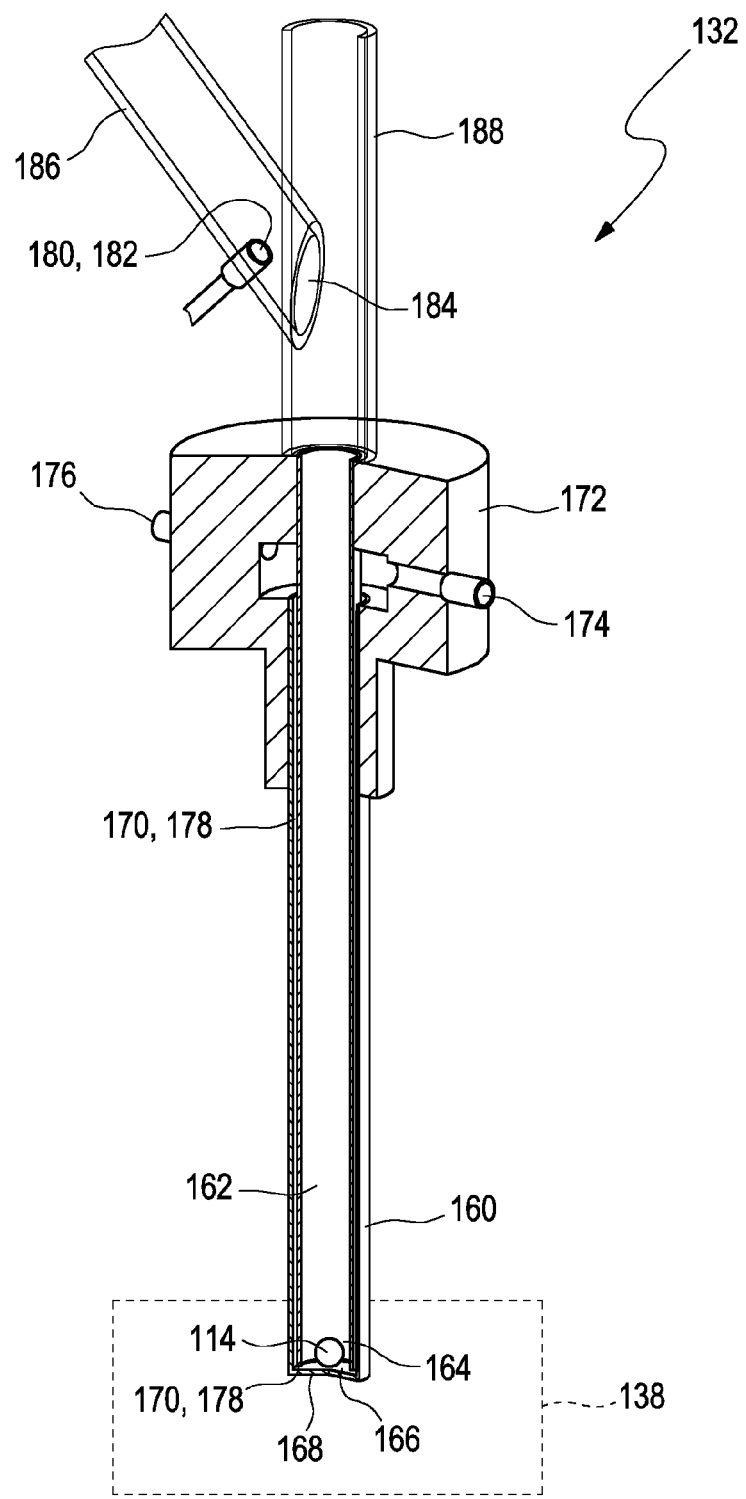
FIG. 2 shows a preferred exemplary embodiment of a sampling device according to the invention.

While the third transporting device 134, which transports the individualized seed grain 114 to the sampling device 132, can likewise be operated by mechanical means, in particular by the effect of gravitational force, and/or by pneumatic means, in particular by means of subjecting it to compressed air, the individualized seed grain 114 is transported to a receiving device 146 for receiving the classified seed grain 114 by means of a fourth transporting device 114, as represented in FIG. 2, by pneumatic means, in particular by means of subjecting it to compressed air. In a particular embodiment, the individualized seed grain 114 may first be fed to the weighing device 126, which in this case is arranged between the sampling device 132 and the receiving device 146, before it is directed to the receiving device 146.

In the embodiment of the system according to the invention that is schematically represented in FIG. 1, the receiving device 146 has three containers 148 designed for receiving the classified seed grain 114. The number of containers 148 may be fixed here according to a desired type of classification of the plurality 112 of seed grains 114. Preferably, as FIG. 1 shows, the containers 148 are arranged next to one another, so that the classified seed grain 114 can be introduced into one of the containers 148 by means of a pivoting device 150. Transport of the individualized seed grain 114 between the pivoting device 150 and the containers 148 by means of a movable fifth transporting device 152 may be performed here likewise by mechanical means, in particular by the effect of gravitational force, and/or by pneumatic means, in particular by means of subjecting it to compressed air. In an alternative configuration, the receiving device 146 may be configured according to the schematic representation in FIG. 3.

In the present exemplary embodiment, the system 110 according to the invention also has an electronic control device 154 for controlling the present system 110. The electronic control device 154 is designed here in particular for controlling the transport of the seed grain 114 from the store 116 to the receiving device 146. In addition, here the electronic control device 154 has a number of further modules, which are designed for further tasks. These include in particular controlling the store 116, the individualizing device 120, the weighing device 126, the sampling device 132, the measuring device 136, the pivoting device 150 and the transporting devices 118, 124, 134, 144, 152.

In addition, the electronic control device 154 may also have a monitor 156 for presenting ascertained measurement data from the measuring device 136 and/or the weighing device 126, in particular in real time. For example, measurement data obtained already while carrying out the sorting method may for this purpose be provided directly and/or in a processed form, for instance as histograms or in the form of statistical analyses, on the monitor 156. In this way, in particular threshold values that are used for classifying the plurality 112 of seed grains 114 can be adapted even already during an ongoing sorting process, for instance by input by means of a keyboard 158. Alternatively or in addition, in this way a remote monitoring (remote control) of the system 110 can be carried out.

FIG. 2 shows a particularly preferred exemplary embodiment of a sampling device 132 according to the invention. The sampling device represented here comprises an outer tube 160, which is designed for receiving the sampling device 132 in the measuring device 136, and also an inner tube 162 for receiving the individualized seed grain 114, the inner tube 162 being inserted in the outer tube 160. The outer tube 160 has here a volume 164, which is located within the sample chamber 138 of the measuring device 136 after the sampling device 132 has been received in the measuring device 136, in order to ensure that the seed grain 114 in the volume 164 is at the same time located in the sample chamber 138 of the measuring device 136.

The individualized seed grain 114, which is intended to be introduced into the sample chamber 138 of the measuring device 136 for investigation, can in this embodiment be introduced through the inner tube 162 into the volume 164 of the outer tube 160, which is at the same time located in the sample chamber 138 of the measuring device 136. For the most precise possible positioning of the individualized seed grain 114 in the sample chamber 138, the individualized seed grain 114 can, in particular by the gravitational force of its own weight, pass from the inner tube 162, which has an opening 166 at the bottom, the lower opening 166 preferably being located within the volume 164 of the outer tube 160, into the outer tube 160, which has a downwardly closed bottom 168.

In the exemplary embodiment represented in FIG. 2, both the outer tube 160 and the inner tube 162 have a round cross-sectional area, the inner tube 162 also being inserted in the outer tube 160 in a centered manner. As a result, an annular intermediate space 170 forms between the outer tube 160 and the inner tube 162. If the volume 164 is thus likewise arranged centered above the closed bottom 168 of the outer tube 160, the individualized seed grain 114 can be introduced directly into the centred sample chamber 138.

In order in particular after a measuring operation has been performed to remove again from the volume 164 of the sampling device 132 the individualized seed grain 114 that has been at least partially classified by means of the measuring device, the intermediate space 170 is designed for pneumatic handling of the at least partially classified seed grain 114, in particular for feeding compressed air into the outer tube 160. In the present embodiment, the sampling device 132 has a connection device 172, which has a receptacle for the outer tube 160 and the inner tube 162 that is configured in such a way that the described annular intermediate space 170 can form between the outer tube 160 and the inner tube 162. Provided in addition in the connection device 172 are an inlet 174, an outlet 176 and also a channel 178 for the compressed air. As represented in FIG. 2, the connection device 172 is designed such that a form- and force-fitting connection is created between the sampling device 132 and a receptacle of the measuring device 136 intended for inserting the sampling device 132 into the measuring device 136.

The individualized seed grain 114 can consequently be carried from the sampling device 132 into the receiving device 146 for the classified seed grain 114 out the outer tube 160 through the inner tube 162 by pneumatic handling, preferably by subjecting it to compressed air and/or by performing an operation of extracting it by suction. In order to ensure here that the classified seed grain 114 is actually directed to the receiving device 146, and cannot for instance incorrectly return to the weighing device 126, the sampling device 132 has here a setting device 180 in the form of an air curtain 182, by means of which an opening 184 between an inlet 186 of the sampling device 132 for the individualized seed grain 114 and an outlet 188 of the sampling device 132 for the classified seed grain 114 can be controlled.

Figure 3:
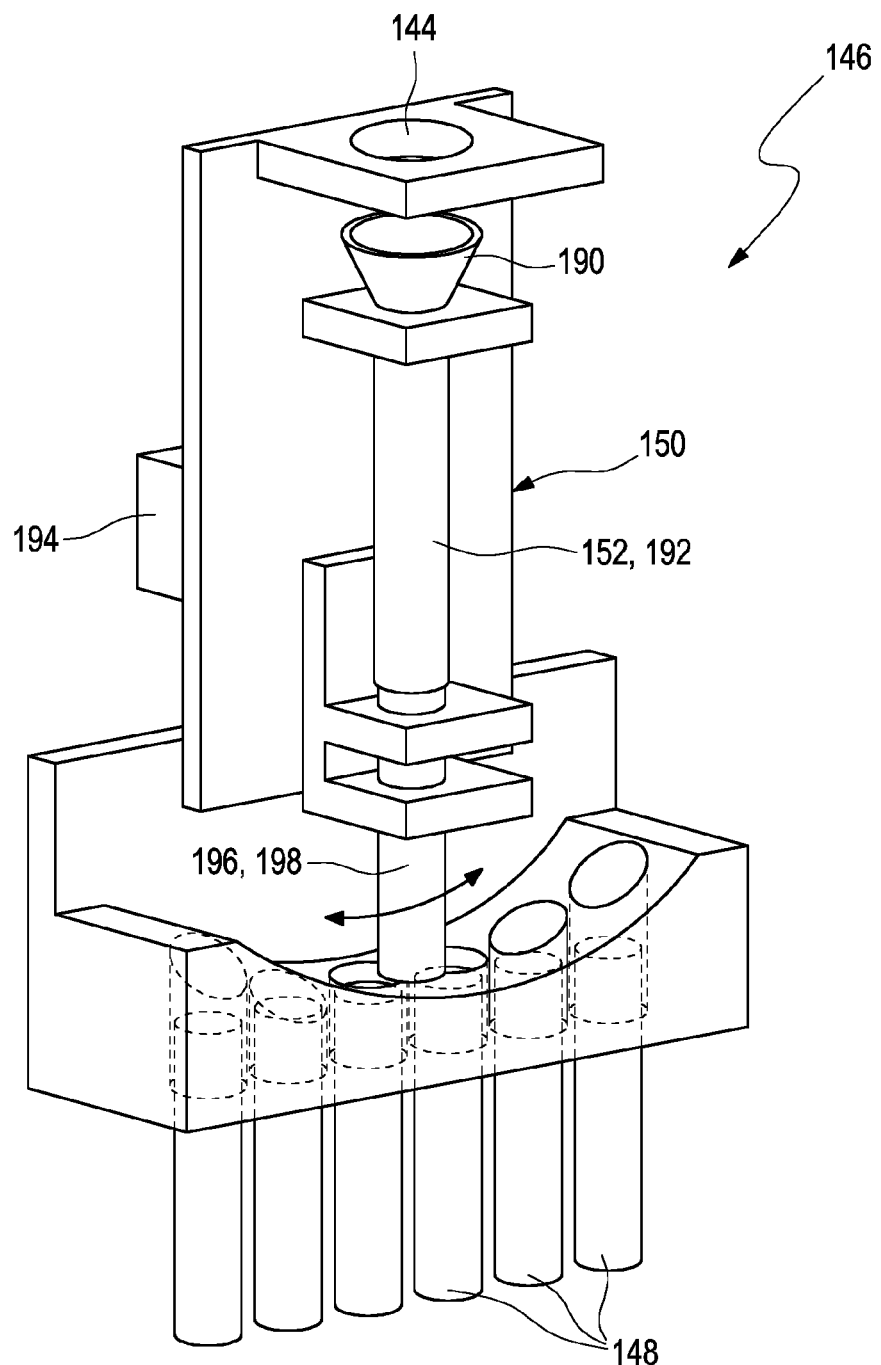
FIG. 3 shows a preferred exemplary embodiment of a first receiving device according to the invention.

FIG. 3 shows a preferred exemplary embodiment of a first receiving device 146 according to the invention. The first receiving device 146 represented here has six containers 148 designed for receiving the classified seed grain 114. As mentioned, the number of containers 148 may be fixed according to the desired type of classification of the plurality 112 of seed grains 114. As FIG. 3 also shows, the containers 148 are arranged next to one another, so that the classified seed grain 114 can be introduced into one of the containers 148 by means of the pivoting device 150.

The already classified seed grain 114 is directed here by means of the fourth transporting device 144, which is pneumatically operated here, out of the sampling device 132 to the pivoting device 150, likewise by pneumatic means, in particular by being subjected to compressed air. The exemplary pivoting device 150 represented in FIG. 3 has a hopper 190 for receiving the classified seed grain 114, which as a result can enter the movable fifth transporting device 152, which is configured here in the form of a flexible tube 192. By means of a stepping motor 194, the pivoting device 150 can be moved in such a way that, as a result, a guiding head 196 assumes a function as a first filling device 198 for distributing and introducing the classified seed grain 114 into one of the containers 148 of the first receiving device 146.

Figure 4:
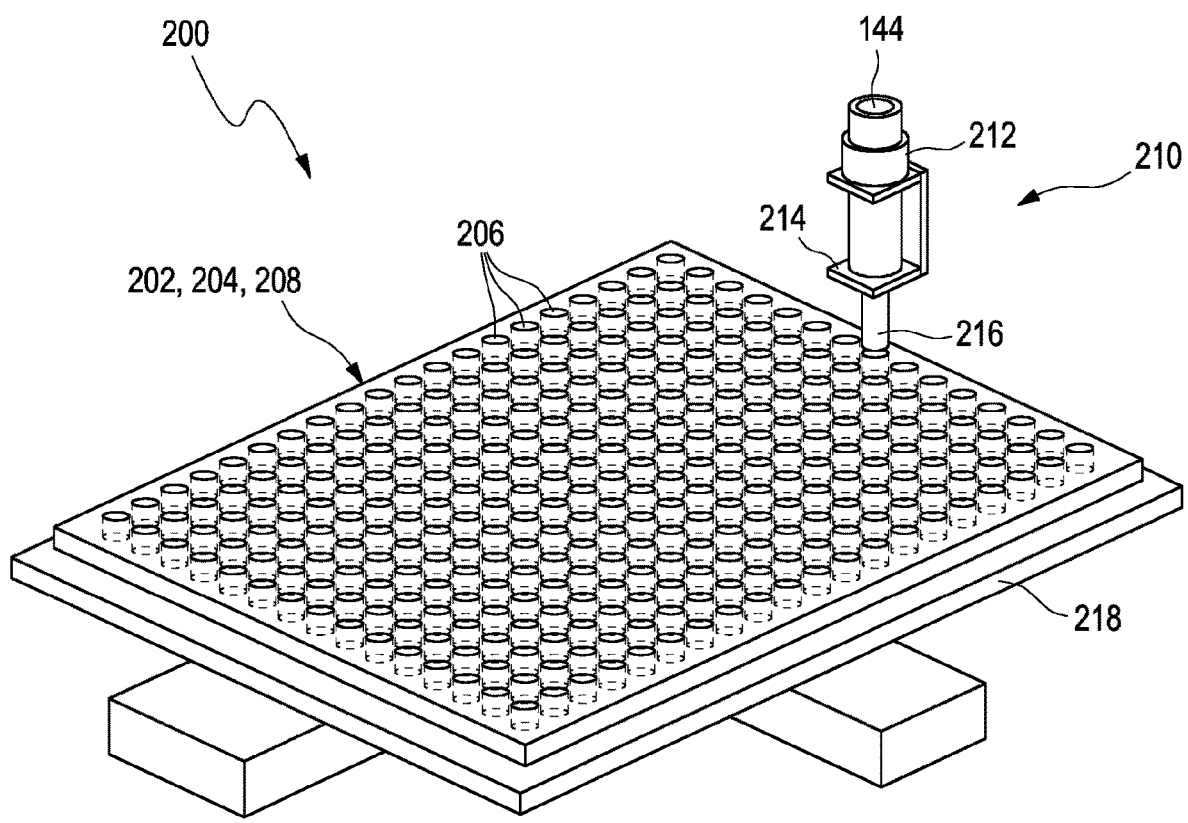
FIGS. 4A and 4B show a preferred exemplary embodiment of a second receiving device according to the invention.
Figure 4:
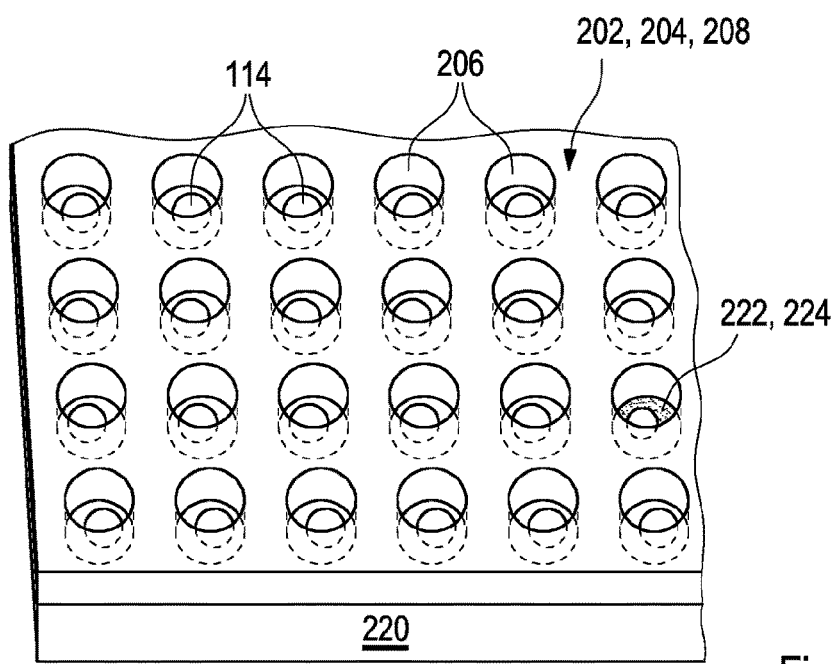

FIG. 4 shows a preferred exemplary embodiment of a second receiving device 200 according to the invention. The exemplary second receiving device 200 represented here has a repository 202 for receiving the classified seed grains 114, here the repository 202 comprising a plate 204, which in this embodiment has 300 depressions 206, which are also referred to as "wells", for receiving in each case precisely one classified seed grain 114 in precisely one depression 206. As FIG. 4A reveals, here the depressions 206 are distributed over the plate 204 in the form of a matrix 208 with 20×15 depressions 206. A mechanically stable, transparent plastic serves here as the material for the plate. Other dimensions and materials are possible for the plate 204, according to the desired intended application and the number of seed grains 114 to be sorted.

For performing the sorting operation, in this embodiment the classified seed grain 114 is introduced into the selected depression 206 by means of a filling device 210 that can be operated by compressed air. The already classified seed grain 114 is directed here by means of the pneumatically operated fourth transporting device 144 from the sampling device 132 to the second filling device 210. The second filling device 210 comprises for this purpose, as represented in FIG. 4A, a compressed air coupling 212, an air distributor 214 and a filling head 216. Also provided here is a movable platform 218, by means of which the plate 204 can be moved within a plane, in order in this way to bring the depression 206 selected for filling with the specific seed grain 114 under the second filling device 210 as directly as possible.

The removal of a specific selected individualized classified seed grain 114 from the plate 204 may be performed in this embodiment by a pneumatic discharge of the selected seed grain 114 into a sample tube, preferably by subjecting the seed grain 114 to compressed air. For this purpose, provided at the bottom of each depression 206 of the plate 204 is a small opening, through which the compressed air required for removing the selected seed grain 114 can be introduced, preferably from below, into the respective depression 206. The movable platform 218 represented in FIG. 4A may also be used correspondingly for the removal of the seed grain 114.

Alternatively or in addition, the specific selected individualized classified seed grain 114 may also be removed from the plate 204 manually. The embodiment represented in FIG. 4B, which has an additional plate 220, which is arranged substantially parallel under the transparent plate 204 containing the seed grains 114 and has an optically controllable display device 222, may be advantageously used for this purpose. The optically controllable display device 222 has a matrix of operable light-emitting diodes (LEDs) 224, it being possible for each depression 206 to be assigned precisely one light-emitting diode 224. In this way, the depression 206 in which the desired seed grain to be removed is located can be clearly indicated by means of the optically controllable display device 222, in order thus to indicate the selected seed grain 114 reliably to a user. In this way, errors in the removal of the individual seed grain 114 can be largely avoided.

| | List of designations |
|---|---|
| 110 | System |
| 112 | Plurality |
| 114 | Seed grain |
| 116 | Store |
| 118 | (First) transporting device |
| 120 | Individualizing device |
| 122 | Vibrating device |
| 124 | (Second) transporting device |
| 126 | Weighing device |
| 128 | Damping device |
| 130 | Precision balance |
| 132 | Sampling device |
| 134 | (Third) transporting device |
| 136 | Measuring device |
| 138 | Sample chamber |
| 140 | NMR measuring device |
| 142 | Radio frequency coil |
| 144 | (Fourth) transporting device |
| 146 | (First) receiving device |
| 148 | Container |
| 150 | Pivoting device |
| 152 | Movable (fifth) transporting device |
| 154 | Electronic control device |
| 156 | Monitor |
| 158 | Keyboard |
| 160 | Outer tube |
| 162 | Inner tube |
| 164 | Volume |
| 166 | Lower opening |

-continued

| List of designations | |
|---|---|
| 168 | Closed bottom |
| 170 | Intermediate space |
| 172 | Connection device |
| 174 | Inlet for compressed air |
| 176 | Outlet for compressed air |
| 178 | Channel for compressed air |
| 180 | Setting device |
| 182 | Air curtain |
| 184 | Opening |
| 186 | Inlet of the sampling device |
| 188 | Outlet of the sampling device |
| 190 | Hopper |
| 192 | Flexible tube |
| 194 | Stepping motor |
| 196 | Guiding head |
| 198 | (First) filling device |
| 200 | (Second) receiving device |
| 202 | Repository |
| 204 | Plate |
| 206 | Depression |
| 208 | Matrix |
| 210 | (Second) filling device |
| 212 | Compressed air coupling |
| 214 | Air distributor |
| 216 | Filling head |
| 218 | Movable platform |
| 220 | Additional plate |
| 222 | Optically controllable display device |
| 224 | Light-emitting diode (LED) |

The invention claimed is:

1. A sampling device for introducing an individualized seed grain into a measuring device, which can be used for the classification of the individualized seed grain, comprising an outer tube for receiving the sampling device into the measuring device, a sample chamber of the measuring device being provided within a volume of the outer tube, the outer tube having a closed bottom;

an inner tube for receiving an individualized seed grain, the inner tube being inserted in the outer tube and having a lower opening, whereby the individualized seed grain can be introduced into the volume of the outer tube; and an intermediate space between the outer tube and the inner tube, the intermediate space being designed in such a way that the individualized seed grain can be discharged by pneumatic means out of the outer tube through the inner tube into a receiving device for a classified seed grain.

2. The sampling device of claim 1, further comprising a setting device for controlling an opening between an inlet for the individualized seed grain and an outlet to the receiving device for the classified seed grain.

3. The sampling device of claim 2, an air curtain being provided for controlling the setting device.

4. The sampling device of claim 1, the sample chamber being located in a centered manner above the bottom of the outer tube and the inner tube being inserted in the outer tube in a centered manner, whereby the individualized seed grain can be introduced into the volume of the outer tube in a centered manner.

5. The sampling device of claim 1, further comprising a connection device for receiving the outer tube, the inner tube and also an inlet and an outlet for an air exchange, the connection device being configured in such a way that an annular intermediate space forms between the outer tube and the inner tube.

6. A system for sorting a plurality of seed grains, comprising at least one individualizing device for individualizing seed grains from a plurality of seed grains provided;

at least one sampling device of claim 1 for introducing the individualized seed grain into a measuring device that can be used for the classification of the individualized seed grain;

at least one filling device for introducing the classified seed grain into a receiving device; and at least one transporting device for the at least partially pneumatic transport of the seed grain from a store into the individualizing device, from the individualizing device into the sampling device and from the sampling device into the receiving device.

7. The system of claim 6, further comprising an electronic control device for controlling the transport of the seed grain.

8. The system of claim 6, the receiving device comprising at least two containers designed for receiving the at least one classified seed grain, the containers being arranged next to one another, it being possible for the classified seed grain to be introduced into a selected container by means of a pivoting device.

9. The system of claim 6, the receiving device comprising a repository for receiving the classified seed grains, the repository having a number of depressions for receiving precisely one classified seed grain, each depression being assigned a unique number, it being possible for the classified seed grain to be introduced into a selected depression by means of the filling device.

10. The system of claim 6, further comprising a weighing device for ascertaining a weight of an individualized seed grain, the transporting device also being designed for transporting the seed grain into the weighing device and out of the weighing device.

11. A method for sorting a plurality of seed grains, with the method steps of:

a) individualizing seed grains from a plurality of seed grains provided;

b) introducing the individualized seed grain into a sampling device of claim 1, the sampling device being designed for introducing an individualized seed grain into a measuring device that can be used for the classification of the individualized seed grain and classifying the individualized seed grain;

c) determining a weight of an individualized seed grain, the individualized seed grains respectively being individually fed mechanically to a weighing device for ascertaining a weight of the individualized seed grain, the weighing device being a precision balance; and d) introducing the classified seed grain into a receiving device by means of a filling device;

the seed grain being transported at least partially by pneumatic means from a store successively to various devices that are respectively designed for carrying out one of the method steps, and method step c) being carried out after method step a) and before method step d).

12. The method of claim 11, the seed grain being carried first onto a planar plate, a transport of the individualized seed grain taking place on the planar plate by way of a lateral mechanical movement of the seed grain over the surface of the planar plate.

13. The method of claim 12, the planar plate having here at least two openings, a first opening being provided for the weighing device and another opening being provided for feeding to the inlet into the sampling device.

14. A computer program which is designed to carry out the steps of the method of of claim 11.

15. An automated high-throughput sorting of seed grains by using at least one sampling device of claim 1 for introducing the individualized seed grain into a measuring device which is designed for investigations of the seed grains by at least one of nuclear magnetic resonance or an optical measuring method.

16. Quality control of seed grains or pills in the pharmaceutical industry by using at least one sampling device of claim 1 for introducing the individualized seed grain or pill into a measuring device.

* * * * *